United States Patent
Manohar et al.

(10) Patent No.: US 9,852,253 B2
(45) Date of Patent: Dec. 26, 2017

(54) AUTOMATED LAYOUT FOR INTEGRATED CIRCUITS WITH NONSTANDARD CELLS

(71) Applicant: Cornell University, Ithaca, NY (US)

(72) Inventors: Rajit Manohar, New York, NY (US); Robert Karmazin, Ithaca, NY (US); Carlos Tadeo Ortega Otero, Ithaca, NY (US)

(73) Assignee: Cornell University, Ithaca, NY (US)

( * ) Notice: Subject to any disclaimer, the term of this patent is extended or adjusted under 35 U.S.C. 154(b) by 0 days.

(21) Appl. No.: 14/891,659

(22) PCT Filed: May 19, 2014

(86) PCT No.: PCT/US2014/038646
§ 371 (c)(1),
(2) Date: Nov. 16, 2015

(87) PCT Pub. No.: WO2014/186803
PCT Pub. Date: Nov. 20, 2014

(65) Prior Publication Data
US 2016/0085898 A1    Mar. 24, 2016

Related U.S. Application Data

(60) Provisional application No. 61/824,985, filed on May 17, 2013.

(51) Int. Cl.
G06F 17/00    (2006.01)
G06F 17/50    (2006.01)

(52) U.S. Cl.
CPC ...... G06F 17/5072 (2013.01); G06F 17/5068 (2013.01); G06F 17/5077 (2013.01); G06F 17/5081 (2013.01)

(58) Field of Classification Search
USPC .......................................................... 716/124
See application file for complete search history.

(56) References Cited

U.S. PATENT DOCUMENTS

| | | | |
|---|---|---|---|
| 6,133,761 A | 10/2000 | Matsubara | |
| 6,321,367 B1 | 11/2001 | Chun et al. | |
| 6,823,500 B1 | 11/2004 | Ganesh et al. | |
| 2002/0069396 A1* | 6/2002 | Bhattacharya | G06F 17/5045 716/102 |
| 2002/0087940 A1* | 7/2002 | Greidinger | G06F 17/5077 716/108 |
| 2003/0121019 A1* | 6/2003 | Brown, III | G06F 17/5068 716/119 |

(Continued)

Primary Examiner — Mohammed Alam
(74) Attorney, Agent, or Firm — Perkins Coie LLP

(57) ABSTRACT

Methods, systems, and devices are disclosed for automatically generating physical layouts of integrated circuits. A circuit is partitioned into one or more cells based on a circuit description. The method further checks availability of a layout of a cell for all the cells generated during the partition step. If a layout of a cell is not available, the method generates a layout of the cell by an automatic tool, and packages the generated layout in a form of a standard cell compatible with a standard cell placement and routing tool. Afterwards, the generated layout may be exported to the standard cell placement and routing tool. Finally, the standard cell placement and routing tool may merge individual layouts of the one or more cells of the circuit to generate a layout for the circuit.

23 Claims, 11 Drawing Sheets

(56) References Cited

U.S. PATENT DOCUMENTS

| | | | |
|---|---|---|---|
| 2004/0225986 A1 | 11/2004 | Lin et al. | |
| 2007/0168898 A1* | 7/2007 | Gupta | G06F 17/5068 716/122 |
| 2010/0169847 A1* | 7/2010 | Gupta | G06F 17/5063 716/122 |
| 2013/0086541 A1* | 4/2013 | Luo | G06F 17/5081 716/112 |

* cited by examiner

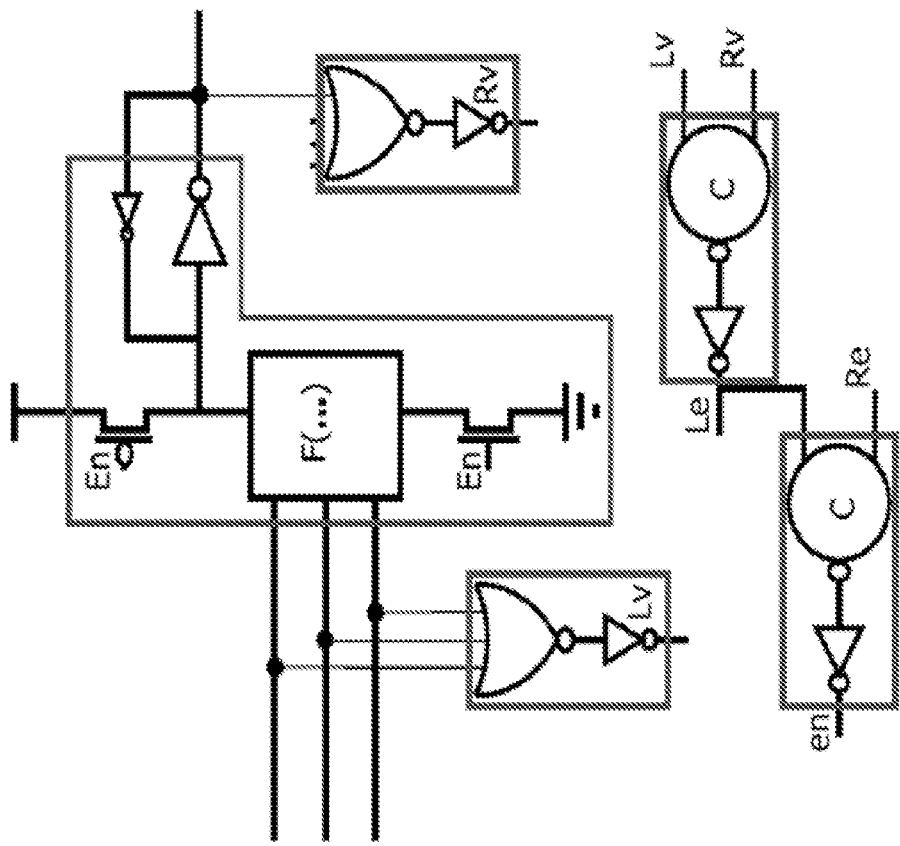
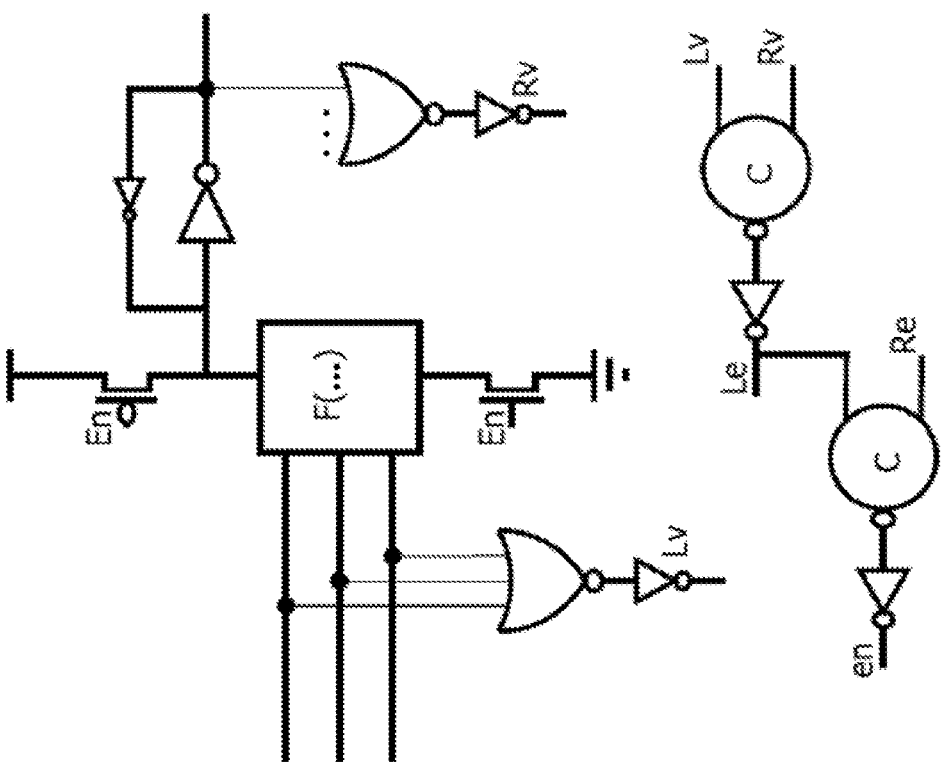
FIG. 2(b)
FIG. 2(a)

(c) Layout of a Nand-gate with inverter (b) Layout of a C-element with inverter (a) Schematic of a WCHB

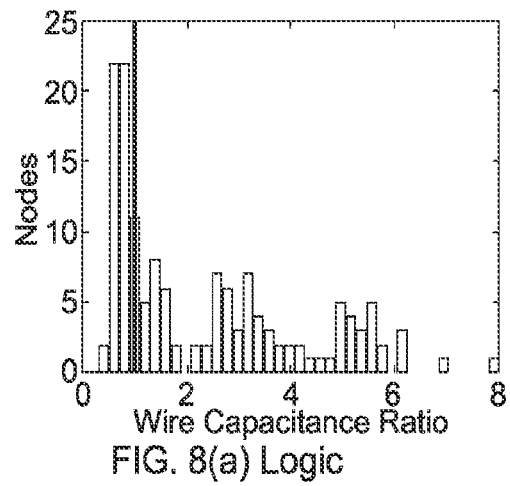
FIG. 8(a) Logic
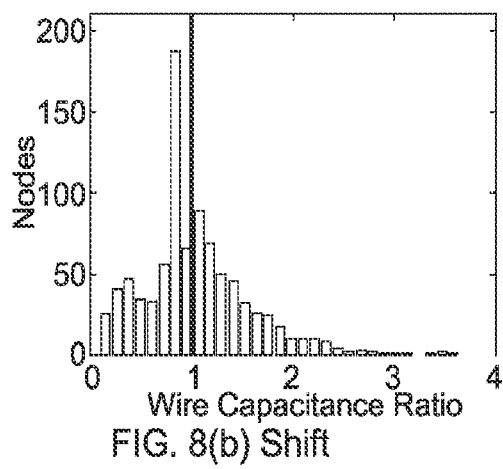
FIG. 8(b) Shift
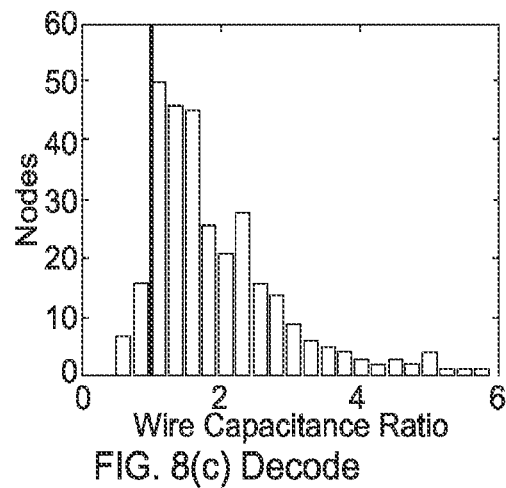
FIG. 8(c) Decode
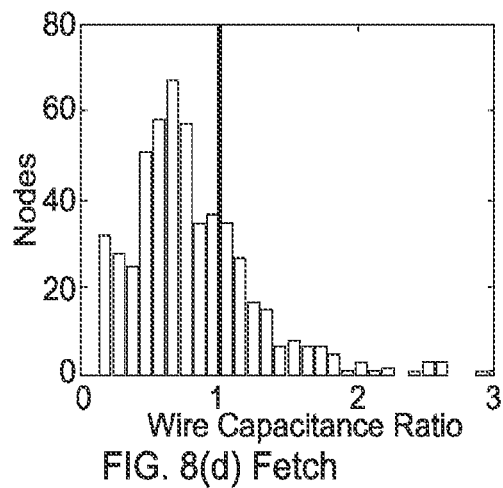
FIG. 8(d) Fetch

AUTOMATED LAYOUT FOR INTEGRATED CIRCUITS WITH NONSTANDARD CELLS

PRIORITY CLAIM AND RELATED PATENT APPLICATIONS

This patent document is a 35 USC §371 National Stage application of International Application No. PCT/US2014/038646 filed May 19, 2014, which further claims priority from U.S. Provisional Patent Application No. 61/824,985 entitled "AUTOMATED LAYOUT FOR ASYNCHRONOUS CIRCUITS WITH NONSTANDARD CELLS" and filed on May 17, 2013, both of which are incorporated by reference in their entirety as part of this document.

STATEMENT REGARDING FEDERALLY SPONSORED RESEARCH OR DEVELOPMENT

This invention was made with the United States government support under grant FA8750-09-2-0010 awarded by the Air Force Rome Labs (AFRL), along with grant CCF-0424422, awarded by the National Science Foundation (NSF). The United States government has certain rights in the invention.

TECHNICAL FIELD

This patent document relates to automating the physical design of integrated circuits.

BACKGROUND

Integrated circuits (IC) can be designed by various computer aided design (CAD) tools. A CAD design flow of an IC is a combination of CAD tools to accomplish the design of an IC, translating a high level behavioral or functional description of the circuit to a physical layout. A circuit can be represented at a variety of levels of abstraction. The commonly used levels of abstraction include algorithmic level or behavioral level, register-transfer level (RTL) or functional level, gate level or schematic level, and finally, the physical layout description. The entire design flow may be divided into different layers—high level synthesis, logic synthesis, placement, and routing, where a tool at one layer normally translates a circuit description at a higher level abstraction to a description of the same circuit at a lower level abstraction.

SUMMARY

The subject matter of this patent document can be implemented in specific ways that provide one or more of the following features. For example, implementations of the disclosed technology can eliminate the need for mapping a circuit to a specific predefined set of standard gates.

In one aspect, a method is provided for automat generating a layout of a circuit. This method includes partitioning a circuit into one or more cells based on a circuit description; checking availability of a layout of a cell of the one or more cells against cells whose layouts that have been previous generated; using the available layout of the cell in a standard cell placement and routing tool by making available the layout of cell in a standard cell "library"; generating the layout of the cell when there is no layout available for the cell, wherein the layout is generated by an automatic tool, and packaged in a form of a standard cell compatible with the standard cell placement and routing tool; and exporting the generated layout of the cell to the standard cell placement and routing tool.

In implementing the above method, one or more of the following may be performed. The method may include using the standard cell placement and routing tool to merge individual layouts of the one or more cells of the circuit to generate a layout for the circuit; the method may include checking the generated layout of the cell to see whether there is any error and generating an error flee layout of the cell by full custom design if the generated layout of the cell has an error; the circuit in the method may be an asynchronous circuit, a static circuit, or a dynamic circuit with a staticizer (feedback); the circuit description may include a functional description of the circuit or a schematic description of the circuit; the method may include translating a functional description associated with the circuit into a transistor-level schematic description of the circuit and partitioning the circuit into one or more cells based on the schematic description, wherein the functional description associated with the circuit may include a set of production rules or a production rule in the set of production rules may include annotated attributes; partitioning the circuit into one or more cells may performed by recursively walking a pull-up and a pull-down transistor network driving a node of the circuit based on a schematic description of the circuit until power rails are reached, then grouping all P- and N-type transistors discovered on the walk into a same cell; in the method, checking availability of the layout of the cell may include checking a schematic description of the cell against a library of cells whose layout have been generated, wherein the method may further include storing the cell with the generated layout into the library of cells whose layout have been generated, after the layout of the cell has been generated.

The above method may also be implemented to further include generating layout of the cell may include grouping transistors of the cell into one or more trails, wherein transistors in a trail can share diffusion area for a source and a drain of transistors; assigning physical dimensions to transistors of a trail to become a stack of transistors, placing the stack of transistors in a layout area with shared diffusion areas; and performing a local routing of the transistors of the cell. In addition, the one or more trails of transistors may be grouped together to minimize breaks in diffusion areas; grouping transistors of the cell into one or more trails may be aided by a diffusion graph of the cell and finding a minimal number of Euler paths for the diffusion graph; performing the local routing of the transistors of the cell may include connecting aligned gates of multiple stacks of transistors by a vertical polysilicon; connecting intra-cell nets; drawing power rails horizontally across a top and bottom of the layout area; and generating pins for the cell connection.

In another aspect, the disclosed method may be implemented to receive a description of a circuit as an input and produces its physical layout by generating customized logic "packaged" in the form of standard cells, which are compatible with widely-used CAD flows. The disclosed method has the advantage of being able to generate custom cells on demand, allowing circuit components, cells, to be mapped directly to the physical layout of the cells, therefore eliminating the need of a traditional synthesis step. This automated approach removes any loss from an inefficient mapping and frees the designer from being tied to a fixed design library. In addition, the disclosed method can be integrated to other CAD tools, allowing for fast physical layout implementations of large designs, while removing the manual labor cost associated with custom logic design. The disclosed method is able to produce layout for, among other things, various parts of a microprocessor with moderate area and performance overheads, and in some cases, improvements over a full custom implementation, at a fraction of the design time needed previously.

The disclosed method can automatically generate a layout for a circuit. The method partitions a circuit into one or more cells based on a circuit description. The method further checks availability of a layout of a cell for all the cells generated during the partition step. If a layout of a cell is available, the layout of the cell can be used by a standard cell placement and routing tool. If a layout of a cell is not available, the method generates a layout of the cell by an automatic tool, and packages the generated layout in a form of a standard cell compatible with the standard cell placement and routing tool. Afterwards, the generated layout of the cell can be exported to the standard cell placement and routing tool. Finally, the standard cell placement and routing tool may merge individual layouts of the one or more cells of the circuit to generate a layout for the circuit.

During the process, the disclosed method may also check the generated layout of the cell to see whether there is any error. When there is any error, the disclosed method may generate an error free layout of the cell by a different means, such as by full custom design.

A machine-readable storage medium with an executable program stored thereon is disclosed. The executable program contains instructions for a processor to perform the following steps: partition a circuit into one or more cells based on a circuit description; check availability of a layout of a cell of the one or more cells; generate the layout of the cell when there is no layout available for the cell, wherein the layout is generated by an automatic tool, and packaged in a form of a standard cell compatible with a standard cell placement and routing tool; and exporting the generated layout of the cell to the standard cell placement and routing tool.

A data processing system is disclosed. The data processing system includes a data storage, a processor, and program instructions stored in the data storage and executable by the processor to carry out the following functions: partitioning a circuit into one or more cells based on a circuit description; checking availability of a layout of a cell of the one or more cells; using the available layout of the cell in a standard cell placement and routing tool; generating the layout of the cell when there is no layout available for the cell, wherein the layout is generated by an automatic tool, and packaged in a form of a standard cell compatible with the standard cell placement and routing tool; and exporting the generated layout of the cell to the standard cell placement and routing tool.

These and other aspects, features and their implementations and variations are described in greater detail in the drawings, the description and the claims.

BRIEF DESCRIPTION OF THE DRAWINGS

FIGS. 2(a)-2(j) show examples of diagrams of circuits represented at different stages of a disclosed design flow until the stage the transistors are placed on layout areas.

FIGS. 8(a)-8(d) show exemplary histogram plots of exemplary implementation results using a disclosed design flow.

DETAILED DESCRIPTION

Figure 1:
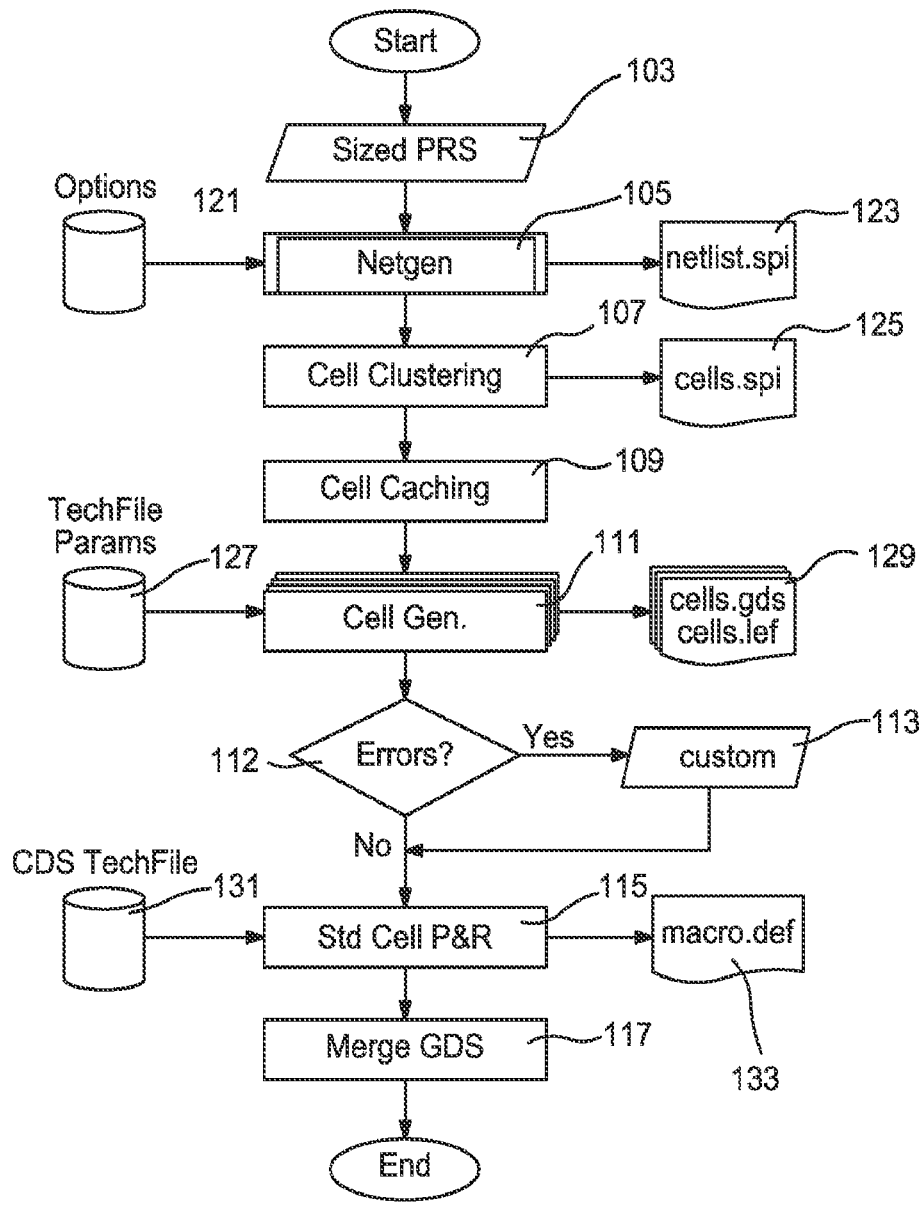
FIG. 1 shows a flow chart of an exemplary design flow and infrastructure to automate the physical design of integrate circuits (IC).

Integrated circuits are complex in their structures and interconnections for various circuit elements. As the IC process technology scales down in size, transistor count and performance increase along with their variability and their susceptibility to environmental changes. Such trends impose challenges to IC designs. For example, designing synchronous digital circuit faces unique challenges in managing clock distribution and signal skew, since a synchronous circuit performs computation based on a trigger from a clock signal. As a result, there is a need for IC designs to include larger margins into designs to ensure correct operation under increasingly uncertain fabrication or environmental conditions.

Asynchronous circuits are a class of self-timed circuits where synchronization is achieved locally, without synchronization to a global clock. In certain applications, asynchronous circuits have the potential to perform faster than synchronous circuits, as well as other advantages including lower power consumption, lower electromagnetic interference, and better modularity in large systems. Asynchronous circuits can be configured to provide delay insensitive (DI) or quasi delay insensitive (QDI) operations and achieve various advantages via specific implementations in a range of applications. Therefore asynchronous circuits are an attractive option to overcome many challenges currently faced by chip designers, such as increased process variation. Unfortunately, the advantages of asynchronous circuits at tackling these challenges are tempered by the lack of mature and accessible computer aided design (CAD) tools. This is especially true for physical design, where the majority of design time is spent. The lack of CAD tools for asynchronous circuits limits the adoption of this promising technology.

The disclosed technology in this patent document can be used to address some of the challenges in IC designs for various circuits including physical designs of both asynchronous circuits and synchronous circuits. Various examples in this document are asynchronous circuits. However, the disclosed technology is applicable to synchronous circuits and other IC circuits.

A CAD design flow of an IC can include a combination of CAD tools to accomplish the design of an IC translating a high level behavioral or functional description of the circuit to the physical layout. A circuit can be represented at a variety of levels of abstraction. The commonly used levels of abstraction are algorithmic level or behavioral level, register-transfer level (RTL) or functional level, gate level or schematic level, and finally, the physical layout description. The entire design flow may be divided into different layers—high level synthesis, logic synthesis, placement, and routing, where a tool at one layer normally translates a circuit description at a higher level abstraction to a description of the same circuit at a lower level abstraction.

High-level synthesis works at a higher level of abstraction of an IC layout, starting with an algorithmic description in a high-level language such as SystemC and Ansi C/C++. The IC designer typically develops the module functionality and the interconnect protocol. The high-level synthesis tools handle the micro-architecture and transform untimed or partially timed functional code into fully timed RTL implementations, automatically creating cycle-by-cycle detail for hardware implementation. The RTL implementations are then used directly in a logic synthesis tool to create a gate-level implementation.

For a synchronous circuit, the function description may be a RTL abstraction used in hardware description languages such as Verilog and VHDL. On the other hand, high-level modeling and synthesis of asynchronous circuits are more based on a language that belongs to the Communicating Sequential Processes (CSP) family of languages, even though VHDL and Verilog can be used as well.

At logic synthesis level, a functional description such as a RTL or CSP description of a circuit is usually converted to a gate-level or transistor level description of the circuit by a logic synthesis tool. The gate-level or transistor level description of the circuit is normally represented by a netlist, which may be called a schematic description of the circuit as well. A netlist describes the schematic connectivity of gates of a circuit, and provides nothing more than instances, nets, and perhaps some attributes.

The logic synthesis results (e.g., netlists) are then used by placement and routing tools to create a physical layout implemented in a VLSI technology. A placer takes a schematic description of the circuit such as a netlist together with a technology library or implementation technology and produces a valid placement layout. After placement, a routing tool adds wires needed to properly connect the placed components while obeying all design rules of the technology. In general, the implementation technologies for the placement and routing tools are classified into three broad categories: technology mapping, custom standard cells, and full custom layout, which are summarized below.

The technique of technology mapping maps customized logic onto an existing cell library, allowing the exploitation of previously designed and characterized libraries, as well as mature application-specific integrated circuit (ASIC) flows. Technology mapping transforms a general Boolean function into a netlist composed of predefined circuit cells with mask layout for the cells provided. The predefined circuit cells may include primitive cells such as INV, AND, OR, NAND, NOR, compound cells such as XOR, AND-OR, MUX, TBUF, various AOI cells, or storage cells such as LATCH, FF. However, the inefficiency of the technology mapping often negates the advantages of having customized logic.

Implementations of the method of custom standard cells tend to require hand-crafted layouts for a library of cells onto which custom logic is mapped. The library of circuit cells used in custom standard cells may be larger than the library of predefined circuit cells used in technology mapping. However, implementing the layout of every possible logic function cell to become a standard cell can be intractable, and each such library needs to cover a specific process technology. This method of custom standard cells is limited in its scope of uses and lacks versatile applications.

The approach of full custom layout involves manually drawing every transistor and wire in the physical layout design, typically yielding a physical layout with the smallest area and best performance. However, it is very expensive in terms of design time and human effort, which typically restricts this approach to only the most critical components of a system.

The disclosed technology in this document relates to CAD tools of circuits. A CAD process and a complete design infrastructure are provided to implement the physical layout of a circuit with the ability to generate physical layout for customized logic cells that is compatible with available ASIC design flows. The disclosed technology, the CAD process, and the design infrastructure, or any part of it, may be collectively referred to as cellTK, while sometimes a component of the disclosed system may have its own name as well.

The disclosed technology can be used to provide an IC design process to include, among others, a nonstandard cell layout generator for accommodating customized circuit features and a physical design infrastructure for allowing automated design processes for customized circuit designs. A nonstandard cell may be an on-demand custom cell that fits into an automated standard cell flow. The disclosed technology can be implemented to automate the custom cell generation and layout, which mitigates the drawbacks of the custom standard cells methodology while still offering the flexibility of full custom and the utility of technology mapping. cellTK can be used to avoid the need for a library onto which circuits are mapped. Rather, desired cells that are in one or more libraries in the conventional designs can be generated on demand as part of the cellTK design flow, yielding a one-to-one mapping between a circuit description and its physical design. Therefore, implementations of the cellTK may minimize or eliminate the need of a preexisting cell library or instrument synchronous netlists with delay lines or flop controllers. The disclosed technology can provide a user control over the generated layout that is generally not possible with previous solutions.

The IC design process based on the disclosed technique begins by receiving a description of the circuit as an input and produces its physical layout implementation by generating customized logic "packaged" in the form of standard cells, which are compatible with and can be integrated into other CAD tool flows. This automated approach removes undesired loss from an inefficient mapping and frees the designer from being tied to a fixed library.

The disclosed design infrastructure can implement a physical layout of an asynchronous circuit with orders of magnitude time savings over expert human effort. The exemplary implementations described show that the disclosed technology is capable of producing circuit layouts for various parts of a microprocessor with moderate area and performance overheads, and can provide improvements over a full custom implementation. Exemplary circuit layouts generated by the described design flow are evaluated against several asynchronous circuit benchmarks for which full custom physical implementations exist. In some cases, the disclosed technology produces layout that have, on average, a 51% area overhead, with a 12% increase in energy and a 9% increase in delay, at a fraction of the time needed.

An exemplary cellTK flow diagram is shown in FIG. 1. In one embodiment, cellTK first partitions a circuit into one or more cells based on a circuit description. The circuit description may be a functional level description or a schematic level description. If the circuit description is a functional level description, a translation from the functional level description to the schematic level description may be performed before partitioning the circuit into one or more cells. cellTK further checks availability of a layout of a cell for all the cells generated during the partition step. If a layout of a cell is available, the layout of the cell can be used by a standard cell placement and routing tool. If a layout of the cell is not available, cellTK generates a layout of the cell by an automatic tool, and packages the generated layout in a form of a standard cell compatible with the standard cell placement and routing tool. Afterwards, the generated layout of the cell can be exported to the standard cell placement and routing tool. In addition, cellTK may use the standard cell placement and routing tool to merge individual layouts of the one or more cells of the circuit to generate a layout for the circuit.

As shown in FIG. 1, at step 103, cellTK receives a functional level description of a circuit as an input. The functional level description may be a hierarchical Production Rule Set (PRS) including a set of Production Rules (PR). At step 105, cellTK translates each PR into a schematic description. The translation may be done using a tool called Netgen, which may take some additional input 121 as the options for the translation, and produce a result component 123. The flow diagram in FIG. 1 is only for illustration purpose and not limiting. Other embodiments may exist. For example, cellTK may merge step 103 and 105 together to take as input a schematic description of the circuit at step 105 without performing the translation at step 103.

At step 107, a clustering or partition is performed on the generated netlist of the circuit to partition or cluster different parts of the transistor-level netlist into cells which may be stored in a file 125. Again, the flow diagram in FIG. 1 is only for illustration purpose and not limiting. Other embodiments may exist. For example, cellTK may even merge step 103, step 105, and step 107 together to produce a partition of the circuit directly from a functional description.

At step 109, a cell cache is maintained such that only unique or not-yet-generated circuit cells continue through the rest of the flow. A cell defined in step 107 is checked against the cache to see whether the cell is in the cache or not. If the cell is already in the cache, then its physical layout may be available already and not need to be generated again, which can reduce the amount of work done. If a cell is not found in the cache in step 109, step 111 generates the physical layout for the cell.

Step 111 may use a two-stage process including a transistor placement stage and a local transistor routing stage to generate the layout. Step 111 may also read a technology file 127 containing process-specific rules for producing legal, i.e., design rule checking (DRC) clean, cells 129.

The generated physical layout at step 111 is checked to see whether there is any error at step 112. If there is any error, then a full custom design may be performed at step 113 for the cell. Step 113 may also design the layout of the cell using other means to ensure the layout is error free.

After the physical layout of the cells are created at step 111 by the tool or at step 113 by hand, they are exported to a standard cell placement and global routing tool at step 115. At step 117, the final layout is generated by merging individual layouts of the cells of the circuit with the geometry drawn during the cell placement and routing phase, creating a physical layout file such as a Graphic Database System (GDS) file ready for fabrication. More details of each step are described in more details below.

At step 103, a functional description of the circuit may be received as an input. The functional description may be a production rule set (PRS), or some other format of functional description. A single PR of the received PRS may take a form: G→S, G is a Boolean expression called the guard, and S is a Boolean assignment. For some embodiments, a PR may include rules for asynchronous circuits as well as for synchronous circuits. Some PR may be for asynchronous circuits that are dynamic circuits, requiring some form of feedback to ensure robust operation. In some other embodiments, a PR may specify a circuit that may need transistor sizing. For example, some ratioed feedback devices might have longer channel lengths. Furthermore, a PR may specify a glitch free circuit. A PR may be further annotated with attributes, e.g., allowing a designer even tighter control over the synthesized transistor netlist. For example, common attributes can include transistor widths and lengths, transistor types (high-$V_t$ or low-$V_t$), and staticizing options (using keepers or feedback transistors) for dynamic nodes.

At step 105, a tool called Netgen (Netlist Generator) syntactically translates every PR into a transistor-level schematic description. The transistor-level schematic description may be a SPICE netlist. The use of Netgen is for example purpose. There may be other tools used to receive other functional description of a circuit and translate it to a circuit schematic description. A single PR of the form: G→S corresponds to a pull-up or pull-down switching network, e.g., depending on whether the Boolean assignment S is true or false, respectively. The ordering of the resulting transistor networks can be deterministically derived from the PR. The power rails can be assumed to be connected to the source terminal of the transistor generated from the left-most literal in the PR guard, and the output net (referred to as a node) is connected to the drain terminal of the transistor derived from the right-most literal of the guard.

For example, the PR a & b→c- is translated by Netgen into a network starting from GND (since node c is being pulled down), connected to the source of a transistor gated by a followed by a transistor gated by b, whose drain is connected to the output node c. The SPICE netlist corresponding to this PR is illustrated as follows:
M0_ GND a #3 GND nfet W=0.3U L=0.12U
M1_ #3 b c GND nfet W=0.3U L=0.12U A PR can be used to express not only static CMOS gates, but also arbitrary transistor netlists from various circuit families. To ensure electrically sound circuits are synthesized, Netgen can automatically staticize dynamic nodes by adding state-holding feedback transistors. These staticizers take the form of either ratioed keepers, i.e., pseudo-static CMOS logic, or non-ratioed transistor networks that implement combinational feedback. This feature can free a designer from manually implementing staticizers, and leading to a cleaner, less cluttered, and easier to maintain a PRS.

Once a schematic description of transistors of a circuit such as a netlist is generated at step 105, transistors of the circuit can be partitioned or clustered into cells at step 107. A cell of a circuit may be a part of the circuit if the circuit is large or complex, or the entire circuit may be clustered as one cell, depending on the size or complexity of the circuit. Cells obtained at step 107 may be similar to the predefined circuit cells used in a library for technology mapping. However, the cells may be more general than those predefined circuit cells. In fact, the cells are generated based on the functionality and requirement of the circuit, and therefore are more flexible than any predefined circuit cell library. The layout of each cell may be generated by a CAD tool in step 111 if the layout of the cell is not already been generated. For example, transistors may be partitioned based on the node which they are driving. For example, cellTK recursively walks the pull-up and pull-down transistor networks driving a particular node until the power rails are reached. All the P- and N-type transistors discovered on this walk are then grouped in the same cell. Any output inverters (defined as inverters that are driven by a particular node) are also grouped in the same cell to reduce that node's capacitance. If a dynamic node is staticized with a ratioed keeper, then the keeper transistors are also grouped in the same cell. However, if the node is staticized with a non-ratioed feedback network, those feedback transistors are grouped into their own cell to keep cell complexity manageable. Alternatively, a gate and the non-ratioed feedback network may be grouped together as well.

At step 109, a cell cache for storing cell design information is maintained to reduce or minimize the amount of work required for the layout generator to generate the layouts for the cells. If a cell is found in the cache, its layout must have been generated before and no need to be regenerated. Therefore the layout of a cell is generated only once when it is not found in the cache, which means it is needed, or on-demand. For the cache to be effective, a lookup of a cell in the cache must take less time than simply regenerating the layout of the cell. A cell may be represented as a graph and stored in the cache. Two cells are identical if their graphs are isomorphic. Thus, performing a graph isomorphism test for every new cell against every cell already existing in the cache should be performed quickly. In general, the graph isomorphism problem can be NP-complete, and is not a reasonable solution for large designs with many cells. Instead, cellTK may use a heuristic method to determine cell equivalence. The exemplary heuristic compares the number of I/O ports, the number of transistors, and the number of nets in the cells. If these simple checks are true, then additional heuristic can be used to determine the existence of structural isomorphism in the cells' connectivity graphs. If these exist with respect to the I/O ports, a cell match can then be assumed. It is noted that this exemplary heuristic does not yield false positives, and the number of false negatives is, in practice, negligibly small.

At step 111, a physical layout of a cell is generated if the cell is not found in the cache. The layout of a cell is generated by a CAD tool which may use a two-stage process including a transistor placement stage and a local transistor routing stage to generate the layout for the cell. The layouts for the cells of a circuit are generated one cell at a time, independent from each other, in sequence or in parallel. When the layouts of cells are generated in parallel, cellTK may employ a server/client model. The client sends requests out to multiple layout servers, each running multiple layout generating threads. Once completed, the client collects all the layouts of all the cells. The exemplary techniques for transistor placement and local routing described are designed to be as generic as possible so that the cellTK flow can handle many potential cell netlists.

At the transistor placement stage of step 111, cellTK can place all the transistors of a cell in as small an area as possible. Other objectives may be used by cellTK to generate the layout, in addition to the minimal area. For example, cellTK may place transistors in rows. In an exemplary 1-D layout style, minimizing cell area is equivalent to minimizing the number of diffusion breaks, or maximizing the sharing of source-drain terminals of logically-connected transistors. To achieve this purpose, cellTK may use a graph formulation to solve the minimization problem. The transistor netlist of the cell may be converted into a diffusion graph where nets are vertices and transistors are edges. Using this formulation, finding a layout with the minimal diffusion breaks is equivalent to finding a layout with the fewest Euler paths (also referred to as trails or chains) that cover the entire diffusion graph. After the fewest Euler paths are found, cellTK may then use these trails as the atomic unit of placement. A trail represents a sequence of transistors in an order sharing the diffusion areas for the source and train.

The disclosed cellTK technology may apply an exemplary approach to search for these optimal trails, in which the search is guided by a gate-ordering, a predetermined order of transistors' gates. cellTK may perform a recursive depth-first search of the diffusion graph, finding a transistor ordering corresponding to the given gate-ordering. A valid match is found when the gate terminals of the resulting transistor ordering match those in the provided gate-ordering. cellTK automatically orients these transistors such that diffusion sharing is maximized. When a given cell has multiple transistor orderings for a single gate-ordering, cellTK searches all potential transistor orderings and chooses the one minimizing the number of diffusion breaks. This exemplary approach has several advantages, including pruning the search space as the algorithm does not have to explore all possible paths through the diffusion graph. Alternatively, cellTK may search all possible combinations of gate orders, and for each gate order, searches all possible permutations and orientations of transistors, to find the transistor ordering minimizing the number of graph covers.

In addition, cellTK may have other features. For example, cellTK may allow for easy user intervention in the case of complex or critical cells, such as memory cells where symmetry is crucial. For cells with complementary pull-up and pull-down transistor networks, the same gate-ordering can be applied to both networks; non-complementary transistor networks require different gate-orderings.

A trail is only a logical sequence of the transistors. A stack is a trail of transistors with assigned physical dimensions. The size of a stack is not solely dependent on its transistors, but also dependent on the dimensions and orientations of the transistors and the rules of the given process technology. Stacks are stored symbolically as linked lists, with each bucket in the list corresponding to either a transistor's source/drain terminal, or a transistor's gate terminal. These buckets also store physical information, such as transistor widths and lengths, as well as the spacing to adjacent transistors and diffusion contacts. This allows cellTK to optimize the stack dimensions by making local adjustments to distances between transistors and contacts while still ensuring all design rule constraints are met.

Transistors of a cell are placed in the layout area based on the stack it belongs to. One stack of transistors is placed in a continuous area. The placer places the stack of transistors by assigning coordinates to the stacks. Stacks are offset in their respective rows in such a way that gates common to both pull-up and pull-down networks align vertically, simplifying the routing problem at the next stage.

FIGS. 2(*a*)-2(*j*) show diagrams of circuits represented at different stages of the design flow as illustrated in FIG. 1, till the stage the transistors are placed on layout areas. FIG. 2(*a*) shows a schematic connection of a circuit. The circuit may be represented by a schematic description such as a netlist, which may be the output of step 105 as shown in FIG. 1. FIG. 2(*b*) shows a partition of the circuit, which may be the result of step 107 of FIG. 1. As shown in FIG. 2(*b*), the circuit is partitioned into 5 cells, each contained within a frame shown in FIG. 2(*b*).

FIG. 2(*c*) shows a schematic of the transistors in a cell, which may be one of the cells in FIG. 2(*b*). FIG. 2(*d*) and FIG. 2(*e*) illustrate the process of the placement of the transistors of the cell shown in FIG. 2(*c*), to illustrate the transistor placement state of step 111. In FIG. 2(*d*), the cell is converted to a diffusion graph, where the edges are labelled by the transistors A, B, C, D, and E, while the nodes are the connection between transistors. An Euler path for the diffusion graph shown in FIG. 2(d) can be the path (GND) A-B-C-D-(OUT)-E-C, which forms one trail. The trail is laid out as a stack in FIG. 2(e). In FIG. 2(e), a diffusion area is laid out first, where the contact nodes such as GND and OUT are labelled according to its position in the diffusion graph. Gate material such as polysilicon may be laid vertically over the diffusion area to form the gate of the transistors, where the gates are labelled as A, B, C, D, E, and C in the order of the transistors formed in the trail. The two diffusion areas labelled as "#3" show that they are connected, corresponding to the node between B and C.

Figure 2D:
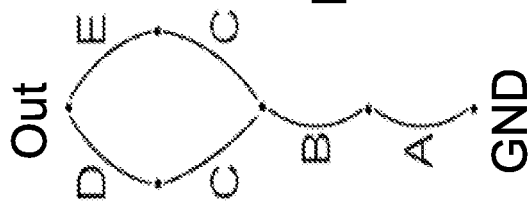
Figure 2C:
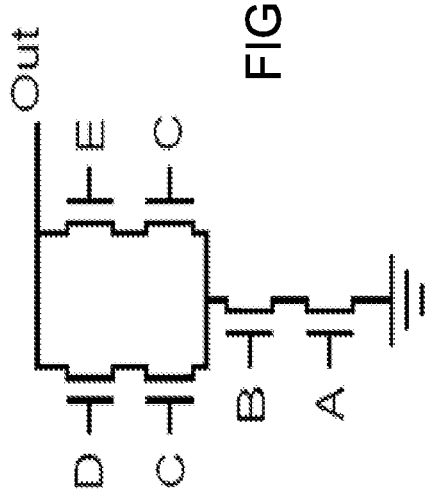
Figure 2E:
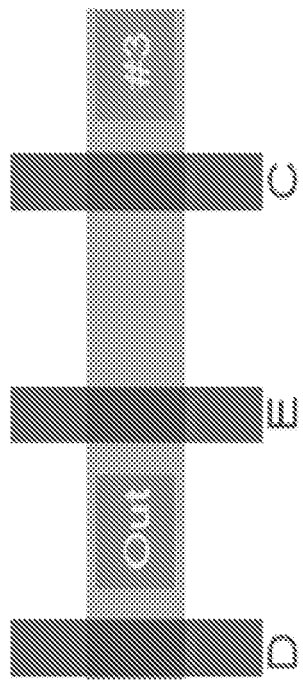
Figure 2G:
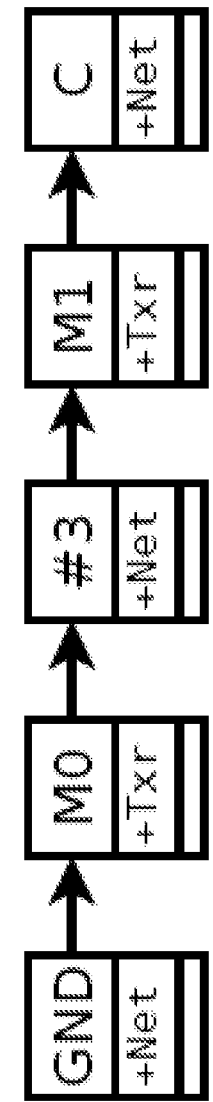
Figure 2H:
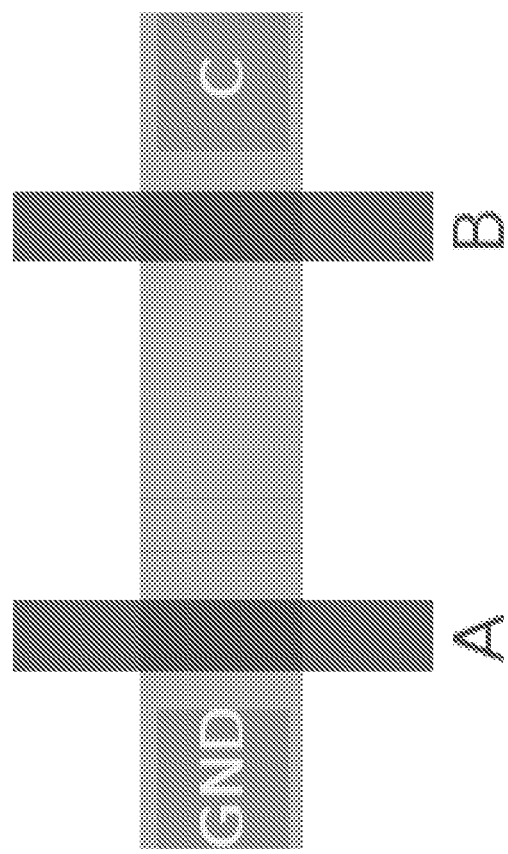
Figure 2F:
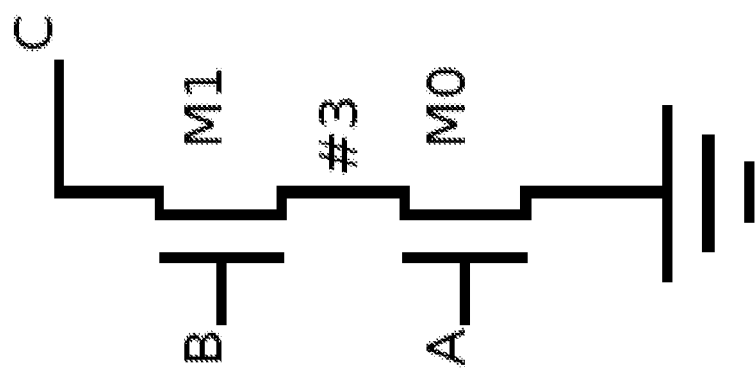

FIG. 2(f) shows another example of a schematic description of transistors of a cell. Without showing the diffusion graph, the transistors are placed as one stack on a shared diffusion area, where the gates of two transistors A and B are laid over a shared diffusion area, as shown in FIG. 2(g). The stack is symbolically represented in memory by a linked list shown in FIG. 2(h), showing each node as a net or a transistor, corresponding to its position in the stack.

Figure 2J:
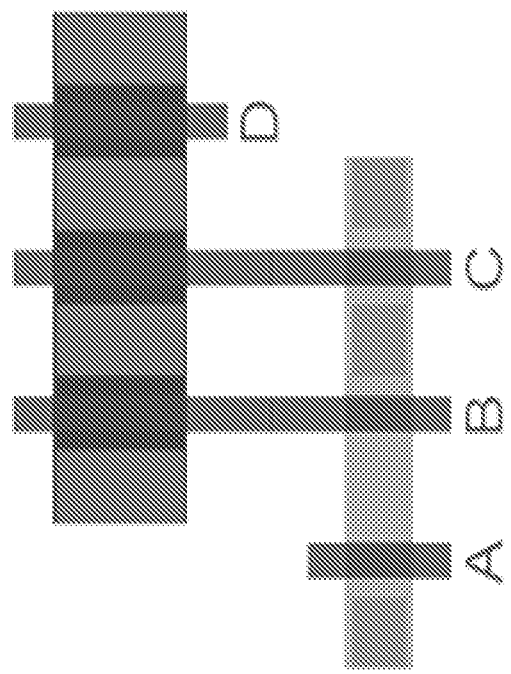
Figure 2I:
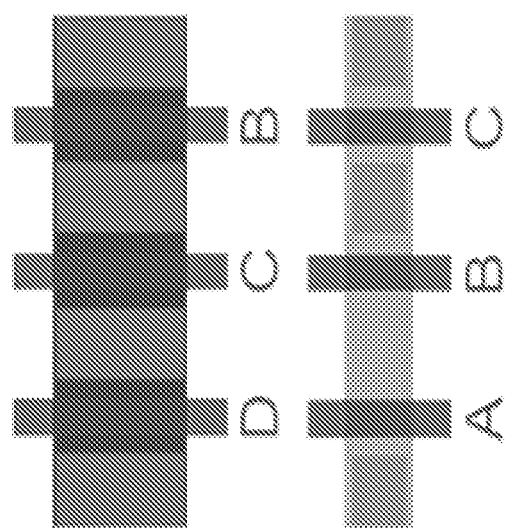

FIG. 2(i) shows two stacks of transistors, one stack includes transistors A, B, and C, another stack includes transistors D, C, B. Therefore the two stacks are connected together by aligning the transistors B and C, so that one gate can go over both diffusion areas, as shown in FIG. 2(j).

Once all the stacks of transistors of a cell are placed in a layout area, the local transistor routing stage of step 111 routes the wire connections to generate the layout for the cell. This stage is only a local transistor routing, as in contrast with a global place and routing at step 115 of FIG. 1. The local transistor routing stage performs routing for the transistors of a cell of a circuit, while the global routing in step 115 connects various cells together.

At the local transistor routing stage, cellTK may complete intra-cell routes first, using as few routing resources as possible, and then complete routes to the cell's I/O ports in higher layers. In more details, the local transistor routing may be done in the following four steps: (1) route the aligned gates, which can be done easily using vertical polysilicon cross the diffusion areas of different stacks, as shown in FIG. 2(j); (2) route all the intra-cell nets, where priority is given to the cell's output node; (3) draw power rails and ground rails horizontally across the top and bottom of the cell, aligned to the routing grid; and (4) draw "pins" for the cell's I/O ports on a midlevel routing layer, which are used as points of contact for the commercial global router at step 115. In each successive step, the local transistor router may be allowed to use more routing resources. For example, in step 1, the local transistor router may be only allowed to use polysilicon to be the gates of transistors, while in step 3, the first and second metal layers are also allowed. The costs of routing in each layer are user-adjustable such that higher level metal layers are used as sparingly as needed.

Figure 3B:
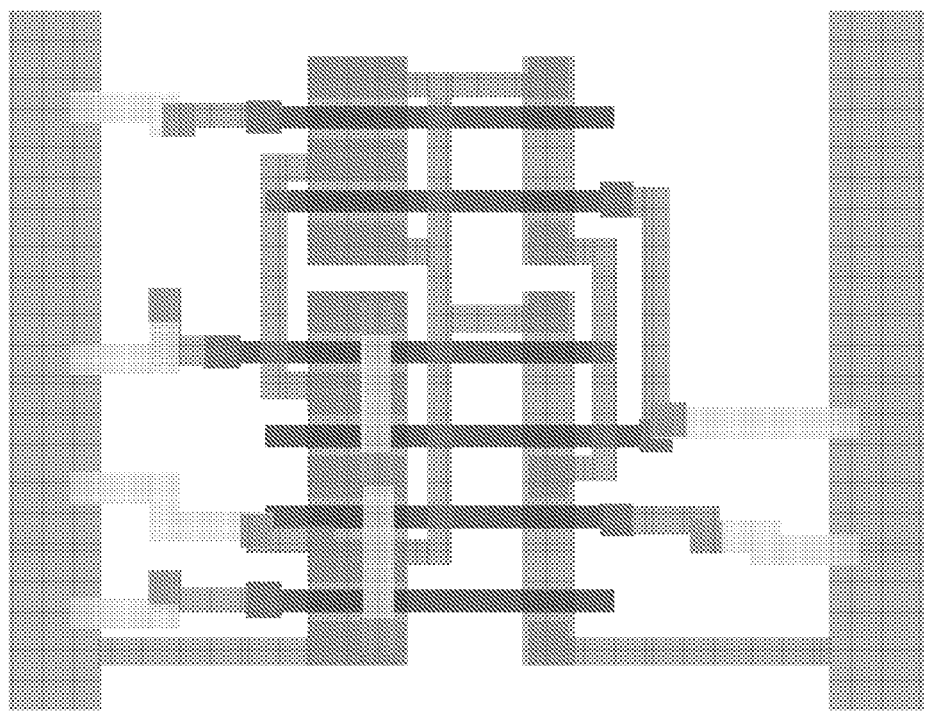
FIGS. 3(a)-3(b) show an example of diagrams of transistors of a cell placement and routing based on a disclosed design flow.
Figure 3A:
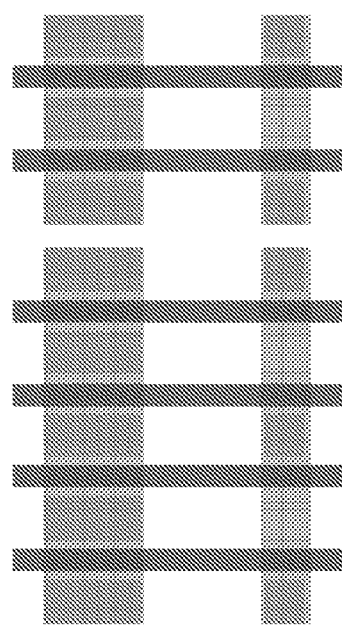

FIGS. 3(a) and 3(b) illustrates an exemplary cell before and after it has been routed. For example, as shown in FIG. 3(a), the cell includes 4 stacks, with shared gates. The shared gates are laid out using aligned polysilicon, corresponding to the result after step (1) described above. FIG. 3(b) shows a completely routed cell with power and ground on top and bottom of the grid.

The exemplary placement strategy described above may require the local transistor router to be capable of very detailed routing, to handle net terminals that are not on any grid or obey any pitch. Alternatively, cellTK can incorporate other available router, such as a different kind of contour based router, a router not based on grid, a tile-based router, instead of building the router from scratch.

For example, a router not based on grid can be used as the local transistor router, allowing it to make fine-grained connections to stack terminals. Given two disconnected terminals of a same net, potential solutions, referred to as paths, are propagated outward into all adjacent tiles free of any material. These new paths are then propagated to the next set of adjacent space tiles. The search space is pruned by not propagating paths whose resulting cost is higher than an existing path's cost. A solution is found when paths from the two terminals intersect in a single space tile. If no solution is found, then previously completed routes are ripped up and the search is repeated until a solution is found, and the ripped nets are rerouted.

The local transistor router can be modified, e.g., where the basic tile is extended with pointers to tiles in adjacent layers to speed up interlayer path propagation. The tile can also be extended with a unique solution tag, allowing the router to rip up portions of a net rather than the entire net.

The local transistor router can be extended to handle minimal area routing constraint. To achieve this goal, paths are extended to include a running total of the amount of material in the current layer. Paths are not allowed to propagate to layers above or below until this amount meets the minimum value set in the technology file. Once a path is propagated to a new layer, this running total is reset.

The local transistor router can be extended to handle exclusive routing directions. Wires to connect any disconnected nodes may be required to be drawn in a single direction or some predetermined direction. The local transistor router can be extended with controls to restrict planar path propagation such that a routing solution has no bends or jogs in a given layer.

The local transistor router can be extended to handle short vertex. A short vertex is defined as a vertex connected to two edges whose lengths do not meet some minimum value. These jagged edges may be flagged as DRC errors. A post-processing step is added to the local transistor router to fix these errors by adding material to smooth out the jagged corner without creating any new spacing violations.

The local transistor router can be extended to handle out-of-order rip-up and reroute. Unlike the original implementation which only allows rip-ups in the reverse order of the route's completion, the local transistor router can rip up portions of nets out-of-order. The rip-up mechanism can be modified to consider spacial and temporal locality. The net chosen for rip-up may be the most recently completed net closest to the net that most recently failed.

There may be instances where cellTK is presented with a difficult routing problem, causing it to timeout. In such instances, cellTK may use a checkpoint and replay method that allows it to generate partially completed cells should an error occur, reducing the amount of manual effort required by the user to complete the route.

There are many other technical existing or developed in the future that can be included in the local transistor router, to handle various kinds of circuits for many kinds of technologies. The examples described above are merely illustrative, not limiting the scope of the disclosed method.

Figure 4:
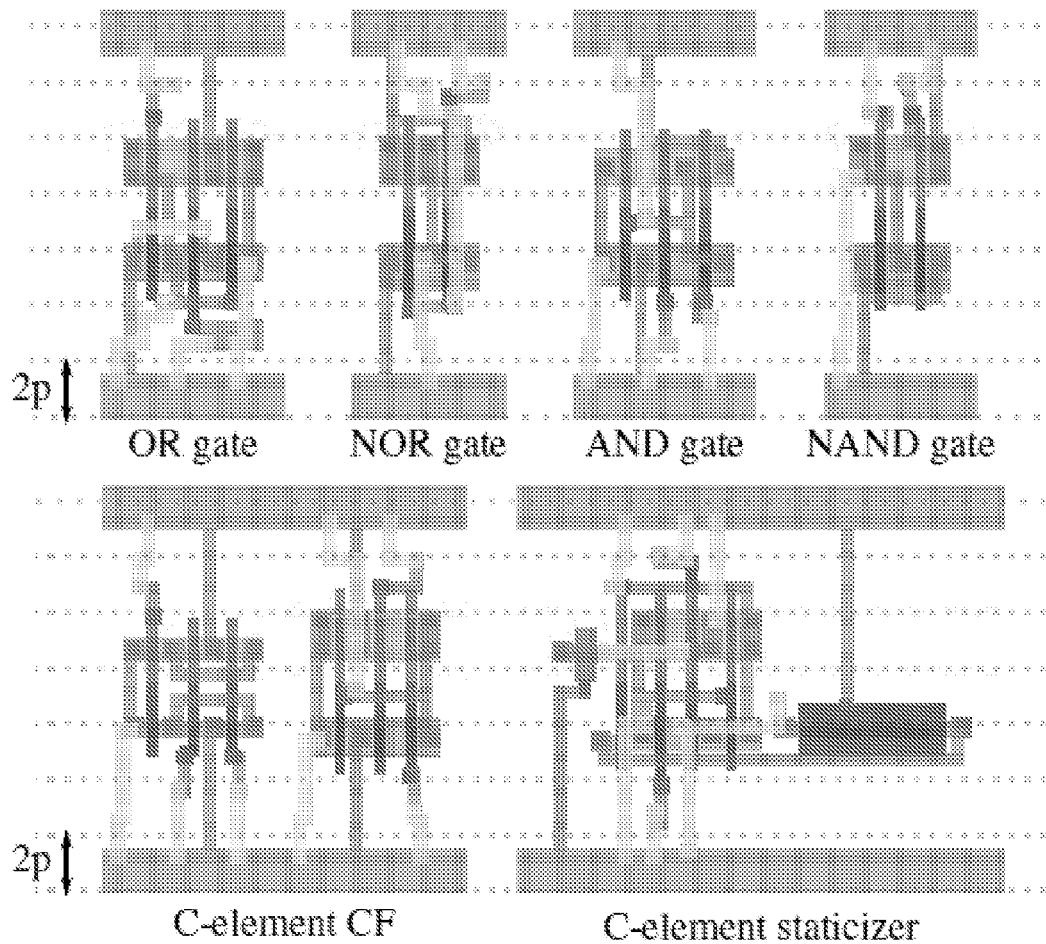
FIG. 4 shows various exemplary circuit layouts produced by a disclosed design flow.

FIG. 4 shows various exemplary circuit layouts produced by the disclosed method, including 2-input OR, NOR, AND, NAND gates, which are found in both synchronous and asynchronous designs, in addition to C-element combinational feedback (CF), and C-element staticized with both combinational feedback and ratioed staticizer, respectively. Transistor gates common to complementary chains are aligned and routed, as are the other nets, pins, and power rails.

Figure 5C:
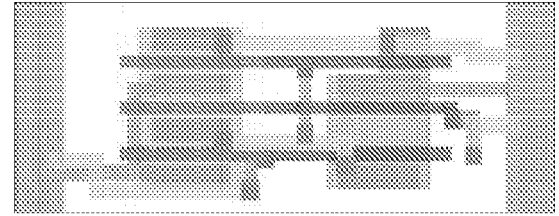
FIGS. 5(a)-5(c) show a schematic diagram and layouts of more exemplary circuits.
Figure 5B:
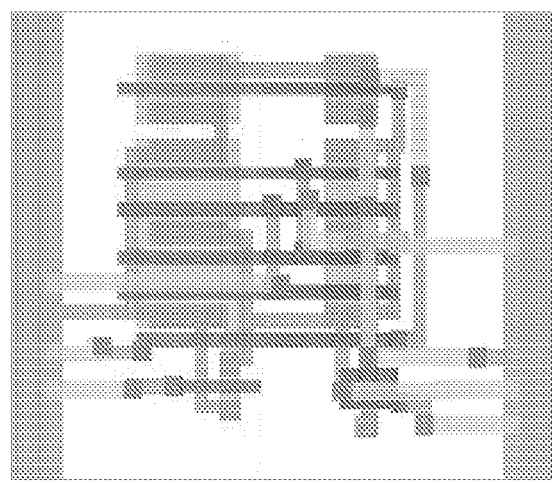
Figure 5A:
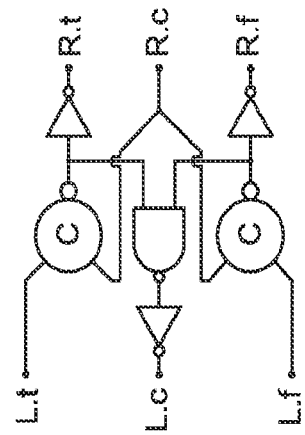

FIG. 5 shows the more complicated weak condition half buffer (WCHB) circuit. As can be seen, both the C-element and the NAND-gate have their output inverters grouped into their respective cells. The C-element cell also contains its ratioed staticizer.

After a physical layout for a cell of a circuit is generated in step 111, the generated layout is checked to see whether there is any error at step 112. The layout of a cell may be checked for error immediately after the layout is generated. The layout of a cell may be checked for error after the layouts of all cells have been generated. Alternatively, these error checks can be performed in step 111 instead of step 112. The division of the steps are only for illustration purpose and not limiting.

The step 112 may check the layout of a cell to make sure design rules for the giving technology process are satisfied. Step 112 may further check the layout of a cell for the following requirements, for example. These requirements are only for examples, there may be other requirements can be checked as well.

Step 112 may check a physical layout of a cell to see whether the layout has a uniformly-positioned wells. If not, wells in adjacent cells may create notches, causing DRC errors. Once all the cells are generated, they are iterated over to find the dimensions of the wells satisfying the DRC rules of all cells.

Step 112 may check a physical layout of a cell to see whether the cell height and width are a multiple of the global routing pitch so cells can be placed on the grid used by the global router. Placing cells on the global router's grid makes it easier to route inter-cell nets, as well as to insert fillers and welltaps.

Step 112 may check a physical layout of a cell to see whether the pins of the layout are drawn on the global router pitch. It may be advantageous to have pins of the layout placed on the routing grid, all their pins will also be on the global router's grid, connecting the intra-cell wiring to the inter-cell routes created by the global router.

If there is any error, then a full custom design may be performed at step 113 for the cell. Step 113 may also design the layout of the circuit using other means to ensure the layout is error free. Therefore the design flow shown in FIG. 1 can allow layouts generated by different means to be integrated together and handled to a commercial placement and globe routing tool in step 115. A designer can even manually decide the layouts of what circuits may be full custom designed, while the others will be generated by the tool disclosed in step 111.

After the physical layout of the cells are created at step 111 by the tool or at step 113 by hand and checked to be error free in step 112, they are exported to a standard cell placement and global routing tool at step 115. Before the layouts of the cells can be placed at step 115, two additional layouts may be needed: a filler cell layout and a welltap cell layout. Welltaps are placed in a repeating pattern throughout the layout, and fillers are used to ensure continuity in the well regions. cellTK can generate these cells automatically based on the cell height and the well positions computed from all the generated cells.

At step 115, once the layouts for all the cells are generated, including the fillers and welltaps, they can be fed into a standard cell placer and router. cellTK can export Library Exchange Format (LEF) files, so cells can be imported by any placer that supports this file format. cellTK also exports a Verilog netlist that captures inter-cell connectivity.

At step 117, the final layout is generated by merging individual layouts of the cells of the circuit with the geometry drawn during the cell placement and routing phase, creating a physical layout file such as a Graphic Database System (GDS) file ready for fabrication. The final layout can be compared against the initial pre-clustered transistor netlist using commercially available layout versus schematic (LVS) tools to ensure the final layout is a correct implementation of the circuit specified as a netlist in step 105.

The disclosed technology cellTK shown in FIG. 1 has been evaluated extensively. cellTK is evaluated against several transistor-level netlists for which a best effort full custom physical layout is available. The majority of these modules were originally part of an asynchronous processor designed in a 90 nm process technology. The evaluated modules are from the main datapath (the logic and shift units) and the instruction front-end (the fetch and decode units). These modules were chosen because they encompass various layout styles, from a structured datapath to a "sea of gates." The logic, shift units were compiled using precharge half buffer reshuffling, similar to the ones found in MiniMIPS. The fetch and decode modules were decomposed using similar techniques as the ones used in the CAM microprocessor.

The metrics used for evaluating the quality of a layout are area, throughput (cycle time), and energy (per cycle). Area is calculated by looking at the bounding box of the final placed and routed design, accounting for the penalty of having some unused space resulting from sub-optimal placement. Energy and cycle times are computed using a transistor-level simulation with resistor and capacitor parasitics extracted from the final layout. Such detailed simulations accurately reflect the impact of cell quality and routing quality on the energy and latency of the generated module.

TABLE I

Evaluation of cellTK Nonstandard Cell Layout

| | Txr Count | Avg Txr/Cell | Total Cells | Cell Height | Wire Cap. μ | Wire Cap. M | Area Overhead | Energy Overhead | Delay Overhead | Manual cells |
|---|---|---|---|---|---|---|---|---|---|---|
| Logic | 736 | 10.2 | 11 | 17 | 2.86 | 1.69 | 76% | 2% | 2% | 1.1 |
| | | | | 14 | 2.41 | 1.63 | 60% | 1% | 1% | 3.3 |
| Barrel Shift | 8000 | 7.42 | 51 | 18 | 1.08 | 0.98 | 28% | −2% | 5% | 0.0 |
| | | | | 17 | 1.10 | 0.94 | 14% | 3% | 10% | 1.1 |
| | | | | 15 | 1.12 | 0.95 | 6% | 9% | 15% | 7.5 |
| Decode | 2698 | 10.2 | 56 | 20 | 1.87 | 1.38 | 92% | 26% | 25% | 1.1 |
| | | | | 17 | 1.87 | 1.61 | 61% | 33% | 50% | 3.0 |
| | | | | 15 | 2.27 | 1.68 | 45% | 34% | 37% | 18.8 |

TABLE I-continued

Evaluation of cellTK Nonstandard Cell Layout

| | Txr Count | Avg Txr/Cell | Total Cells | Cell Height | Wire Cap. μ | Wire Cap. M | Area Overhead | Energy Overhead | Delay Overhead | Manual cells |
|---|---|---|---|---|---|---|---|---|---|---|
| Fetch | 3517 | 7.67 | 99 | 20 | 0.88 | 0.71 | 166% | −3% | −17% | 1.1 |
| | | | | 17 | 0.83 | 0.69 | 120% | −3% | −17% | 6.5 |
| | | | | 15 | 0.86 | 0.73 | 98% | −3% | −16% | 16.12 |
| Average (shortest height) | — | — | — | — | 1.66 | — | 51% | 11.75% | 9.25% | 15% |

Exemplary results of this exemplary evaluation are presented in Table I. For example, total transistor count, average number of transistors per unique cell, and total number of cells are presented. Area is expressed as a percentage overhead over the full custom implementation of the module. The metrics μ and M represent the mean and median of the wire capacitance ratios of all nets in the design, respectively. μ is computed by Eq. (1), where C is the extracted wiring capacitance.

$$\mu = \frac{1}{N} \times \sum_{i \in nodes}^{N} \frac{C_{i,celltk}}{C_{i,full\ custom}} \quad (1)$$

Energy and delay are also expressed as a percentage overhead over the full custom layout. The last metric, the number of cells requiring manual effort, is represented as a tuple (x, y), where x is the number of failing cells fixed by transistor folding, and y is the number of failing cells for some other reason (usually routing failures).

Figure 6:
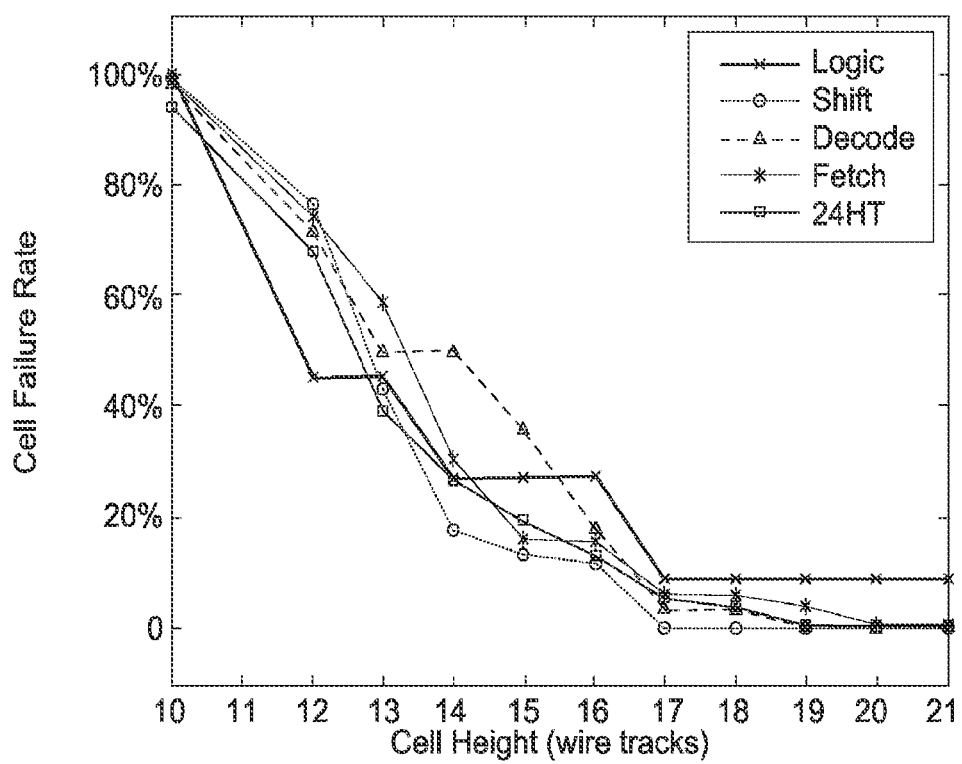
FIG. 6 shows an exemplary data plot of exemplary implementation results using a disclosed design flow.

For each of the evaluated modules, the layout was generated with multiple cell heights. FIG. 6 shows a data plot of exemplary implementation results of the rate of failure as cell heights shrink. As shown in FIG. 6, the taller cells have fewer failures than shorter cells. This is because as cell heights shrink, there is less room for intra-cell routing. However, at a cell height of 15 routing tracks, there is a sharp inflection point in the failure rate. At this height, cell failures are caused by the transistors, not just by routing errors. For this reason, for example, the exemplary implementations of cellTK did not include evaluating for cell heights less than 15 routing tracks, except for the logic core. Generally, the magnitudes and trends of the overheads incurred by using cellTK over full custom layout are dependent on the type of module. For example, the area penalty for the logic block is larger compared to the shifter, a result of the shifter's more complicated connections: cellTK is better able to discover difficult routing solutions, resulting in many more wires routed over cells, whereas the custom layout requires reserved space for the wiring. This also explains the small μ for the barrel shifter. Alternatively, control-heavy modules like the decode, which fall under the "sea-of-gates" category, have larger area, energy, and delay overheads when laid out using cellTK. The cluttered nature of the logical connections presents a difficult problem for the standard cell placer. Careful planning by designers yields a near optimal placement and routing of the cells, which is difficult to achieve with automated tools.

Figure 7A:
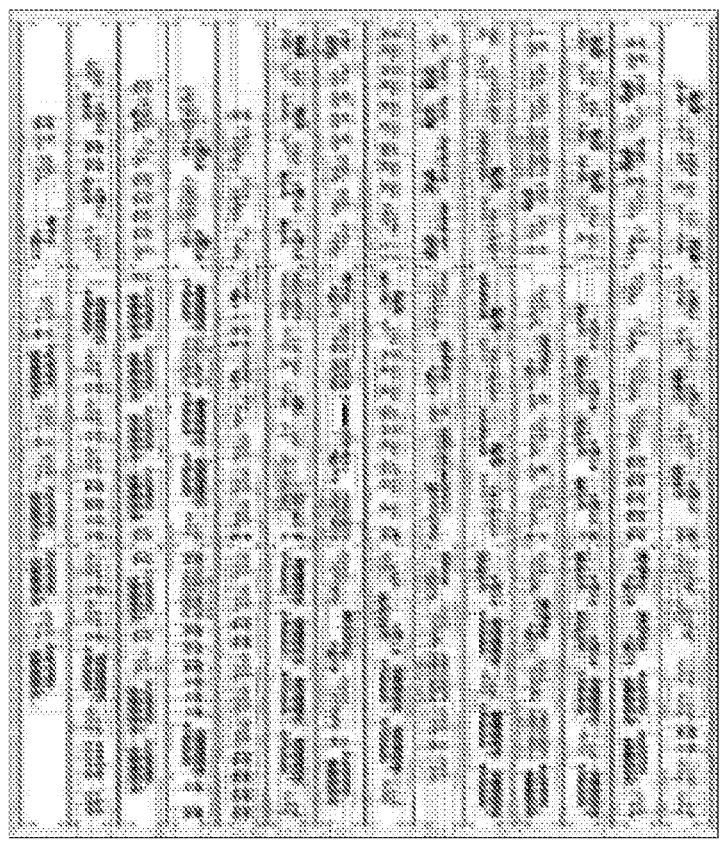
FIGS. 7(a)-7(b) show a top view image of a layout of an exemplary decode module designed using a disclosed design flow.
Figure 7B:
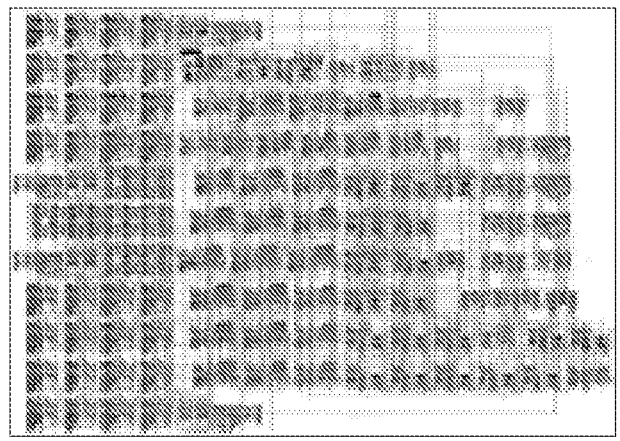

FIG. 7 shows a top view image of a layout of an exemplary decode module, e.g., with nonstandard cells (left) and best-effort full custom (right); and a cell height of 20 tracks was used in this exemplary implementation. As expected, the area overhead of the generated layout for all the benchmarks decreases with smaller cell heights. An unexpected result is that energy and delay get worse as cell heights shrink. This is because for smaller cell heights, increased cell density presents a more difficult problem to the global router, generating worse routes. For example, this is verified by examining mean net capacitances, which increase with decreased cell heights.

Another interesting result is that the fetch module generated by cellTK improves the energy and delay over the full custom implementation, despite the large area overhead, a consequence of the module architecture as well as a human's inclination for modular design. The fetch module contains an adder and a register, which in the custom implementation, are placed side-by-side, whereas cellTK can interleave cells from these sub-modules, reducing average wire length, and consequently, energy and delay. This intuition is confirmed by FIG. 8, which shows a histogram of wire capacitance ratios for all nets (e.g. used to compute μ). For the fetch module, the majority of nets have capacitance ratios less than 1, indicating that cellTK produces a layout where most nets are less capacitive than those in the full custom implementation. In contrast, for example, the majority of nets in the decode module have capacitance ratios greater than 1, incurring significant energy and delay overheads.

Table II below shows the improvement in design time using the disclosed cellTK technology, for example, as compared to custom implementation by experienced designers. In particular, for example, the barrel shift and decode units were laid out by professional layout engineers with 6+ years of experience. Due to the inaccuracies of quantifying human labor, Table II contains approximations for the custom design time. Nevertheless, the orders of magnitude savings in design time is still apparent.

TABLE II

Design Time of Different Modules

| | Full custom Design Time (months) | Celltk Design Time Computer (minutes) | Celltk Design Time Human (minutes) |
|---|---|---|---|
| Logic | ■ | 2 | 40 |
| Barrel Shift | ■■■■■ | 10 | 60 |
| Decode | ■■■■ | 4 | 480 |
| Fetch | ■■ | 13 | 1200 |

The exemplary implementations included, e.g., as verification of the viability, versatility, and usefulness of the disclosed cellTK technology, the design, implementation, and fabrication of two chips using this flow. For example, the first is a 6-channel baseband GPS processor, and the second is an asynchronous FPGA. A summary of the exemplary results are presented in Table III.

TABLE III

Full Chip Designs Finished with cellTK

|  | GPS | FPGA |
| --- | --- | --- |
| Technology Node. | 90 nm | 130 nm |
| Total Txr. Count | 3.20M | 1.33M |
| Unique Cells (manuals) | 1404 (55) | 180 (24) |
| Cell Height (tracks) | 22 | 15 |
| Chip Dimensions | 4 mm × 5 mm | 3 mm × 3 mm |

The evaluation results demonstrates that the disclosed cellTK technology can handle complex designs with relatively little manual effort as well as easily port to multiple technology nodes from different foundries. For example, the GPS is particularly noteworthy because it was designed using both QDI and bundled-data families of asynchronous circuits, both of which are compatible with cellTK. Additionally, the disclosed cellTK technology is capable of generating cells for both 65 nm and 45 nm technology nodes.

cellTK may be used to generate layouts for nonstandard cells to automate layout for circuit families for which standard cell libraries do not exist. It is evaluated in asynchronous circuits, but it can be applied to a much broader range of circuit families, such as domino logic in the synchronous domain. Furthermore, the cellTK flow can be extended for various applications.

The methods employed by cellTK to generate cells are built on top of low-level functions that manage transistors and stacks, as well as control the contour router. These functions are grouped together in a library, which has a generic interface, allowing the library to be used for a number of different physical design applications, such as datapath generators or memory compilers, with the cell generation described above being just one of them.

One of the exemplary advantages of having this level of automation is the ability to easily explore various design tradeoffs that would otherwise be impossible due to the high cost of implementing physical layout. cellTK allows the user to collect statistics about the circuit quickly, which can aid in making informed decisions at all design levels, from the architecture down to the layout.

The disclosed tool may provide the following statistics such as finding the cell height, diffusion density, area estimate and checking the conformity.

Cell height is one of the most important factors affecting the quality of the final layout. In the current implementation, all cells may have the same height. cellTK offers a search feature to find the smallest height for which cells can be successfully generated. A failure tolerance value is provided, which sets the number of cells that a user is willing to manually implement. For example, if it is critical to have a small row height, the user may choose to minimize cell height at the expense of accepting a higher failure rate.

Before actually placing and routing a macro block, cellTK is able to provide estimates for the diffusion density as well as overall area by sampling the cells that were just produced. These statistics are usually available within a couple of minutes of initializing cellTK, even for million-transistor designs.

Should cellTK fail on certain cells, statistics are reported back to the user regarding potential causes for this failure. Specifically, cellTK reports which transistors have the largest dimensions, and the cells of which they are a part, informing the user about where folding should take place as a potential fix for the failing cell.

cellTK can be used to generate cells in the traditional 1-D layout style and also cells in other styles. For example, a user might want to explore the tradeoffs of placing transistors of the same type in multiple rows, requiring an increase in cell height, but decreasing the cell width, a worthwhile tradeoff if the design already contains many wide transistors that would otherwise require folding. Another example is having the power rails routed on different materials. Traditionally, cells' power and ground rails are routed on the first metal layer above and below the active regions, respectively. These power rails can alternatively be routed on higher metals over the active region, effectively compressing cell height, allowing rows of cells to be grouped tighter, and increasing overall diffusion density.

This document presents an automated nonstandard cell physical layout generator and a complete design infrastructure to physically implement an asynchronous digital netlist. The disclosed example of the design flow eliminates the need for a predefined cell library and can automatically generate a generic and versatile layout library which can physically implement an arbitrary transistor netlist, independent of logic family and design paradigm. This design process provides flexibility and versatility in IC designs, remove limitations in predetermined libraries and can significantly reduce the layout design time. Therefore, cellTK enables the widespread adoption of asynchronous circuits as a solution to future technology challenges.

Implementations of the subject matter and the functional operations described in this document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

While this document contain many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

The invention claimed is:

1. A method for automatically generating a layout of a circuit, comprising:
    partitioning a circuit into one or more cells based on a circuit description;
    checking availability of a layout of a cell of the one or more cells;
    using the available layout of the cell in a standard cell placement and routing tool;
    generating the layout of the cell when there is no layout available for the cell, wherein the layout is generated by an automatic tool, and packaged in a form of a standard cell compatible with the standard cell placement and routing tool; and
    exporting the generated layout of the cell to the standard cell placement and routing tool, wherein generating the layout of the cell comprises:
    grouping transistors of the cell into one or more trails, wherein transistors in a trail can share diffusion area for a source and a drain of transistors;
    assigning physical dimensions to transistors of a trail to become a stack of transistors;
    placing the stack of transistors in a layout area with shared diffusion areas, and
    performing a local routing of the transistors of the cell.

2. The method of claim 1, further comprising:
    using the standard cell placement and routing tool to merge individual layouts of the one or more cells of the circuit to generate a layout for the circuit.

3. The method of claim 1, further comprising:
    checking the generated layout of the cell to see whether there is any error; and
    generating an error free layout of the cell by full custom design if the generated layout of the cell has an error.

4. The method of claim 1, wherein the circuit includes an asynchronous circuit.

5. The method of claim 1, wherein the circuit includes a dynamic circuit with a feedback.

6. The method of claim 1, wherein the circuit includes a static circuit.

7. The method of claim 1, wherein the circuit description includes a functional description of the circuit or a schematic description of the circuit.

8. The method of claim 1, further comprising:
    translating a functional description associated with the circuit into a transistor-level schematic description of the circuit; and
    partitioning the circuit into one or more cells based on the schematic description.

9. The method of claim 8, wherein the functional description associated with the circuit is a set of production rules.

10. The method of claim 9, wherein a production rule in the set of production rules includes annotated attributes.

11. The method of claim 1, wherein checking availability of the layout of the cell includes checking a schematic description of the cell against a library of cells whose layout have been generated.

12. The method of claim 11, further comprising:
    storing the cell with the generated layout into the library of cells whose layout have been generated, after the layout of the cell has been generated.

13. A machine-readable storage medium with an executable program stored thereon, wherein the executable program contains instructions for one or more processors to perform the following:
    partition a circuit into one or more cells based on a circuit description;
    check availability of a layout of a cell of the one or more cells;
    generate the layout of the cell when there is no layout available for the cell, wherein the layout is generated by an automatic tool, and packaged in a form of a standard cell compatible with a standard cell placement and routing tool; and exporting the generated layout of the cell to the standard cell placement and routing tool;
group transistors of the cell into one or more trails, wherein transistors in a trail can share diffusion area for a source and a drain of transistors;
assign physical dimensions to transistors of a trail to become a stack of transistors;
place the stack of transistors in a layout area with shared diffusion areas, and
perform a local routing of the transistors of the cell.

14. The machine-readable storage medium of claim 13, wherein the executable program contains instructions for the processor to further perform the following:
use the standard cell placement and routing tool to merge individual layouts of the one or more cells of the circuit to generate a layout for the circuit.

15. The machine-readable storage medium of claim 13, wherein the executable program contains instructions for the processor to further perform the following:
check the generated layout of the cell to see whether there is any error; and
generate an error free layout of the cell by a second means if the generated layout of the cell has an error.

16. The machine-readable storage medium of claim 13, wherein the circuit description includes a functional description of the circuit or a schematic description of the circuit.

17. A circuit design system, comprising:
a storage medium;
a processor; and
program instructions stored in the data storage and executable by the processor to carry out functions including:
partitioning a circuit into one or more cells based on a circuit description;
checking availability of a layout of a cell of the one or more cells;
using the available layout of the cell in a standard cell placement and routing tool;
generating the layout of the cell when there is no layout available for the cell, wherein the layout is generated by an automatic tool, and packaged in a form of a standard cell compatible with the standard cell placement and routing tool; and
exporting the generated layout of the cell to the standard cell placement and routing tool;
grouping transistors of the cell into one or more trails, wherein transistors in a trail can share diffusion area for a source and a drain of transistors;
assigning physical dimensions to transistors of a trail to become a stack of transistors;
placing the stack of transistors in a layout area with shared diffusion areas, and
performing a local routing of the transistors of the cell.

18. The data processing system of claim 17, wherein program instructions stored in the data storage and executable by the processor to carry out functions further including:
using the standard cell placement and routing tool to merge individual layouts of the one or more cells of the circuit to generate a layout for the circuit.

19. The data processing system of claim 17, wherein program instructions stored in the data storage and executable by the processor to carry out functions further including:
checking the generated layout of the cell to see whether there is any error; and
generating an error free layout of the cell by a second means if the generated layout of the cell has an error.

20. The data processing system of claim 17, wherein the circuit description includes a functional description of the circuit or a schematic description of the circuit.

21. The method of claim 1, wherein the one or more trails of transistors are grouped together to minimize breaks in diffusion areas.

22. The method of claim 1, wherein grouping transistors of the cell into one or more trails is aided by a diffusion graph of the cell and finding a minimal number of Euler paths for the diffusion graph.

23. The method of claim 1, wherein performing the local routing of the transistors of the cell comprising:
connecting aligned gates of multiple stacks of transistors by a vertical polysilicon;
connecting intra-cell nets; and
drawing power rails horizontally across a top and bottom of the layout area.

\* \* \* \* \*